(12) United States Patent
Huang et al.

(10) Patent No.: US 8,977,666 B2
(45) Date of Patent: Mar. 10, 2015

(54) ADAPTIVE FILTER WITH REDUCED COMPUTATIONAL COMPLEXITY

(71) Applicant: Realtek Semiconductor Corp., Hsinchu (TW)

(72) Inventors: Cheng-Yi Huang, Hsinchu (TW); Yi-Lin Li, Hsinchu (TW)

(73) Assignee: Realtek Semiconductor Corp., Hsinchu (TW)

( * ) Notice: Subject to any disclaimer, the term of this patent is extended or adjusted under 35 U.S.C. 154(b) by 376 days.

(21) Appl. No.: 13/629,243

(22) Filed: Sep. 27, 2012

(65) Prior Publication Data

US 2013/0077668 A1 Mar. 28, 2013

(30) Foreign Application Priority Data

Sep. 28, 2011 (TW) .............................. 100135120 A (51) Int. Cl.
*G06F 17/10* (2006.01)
*H04L 25/03* (2006.01)
*H03H 21/00* (2006.01)

(52) U.S. Cl.
CPC .. *H04L 25/03019* (2013.01); *H03H 2021/0092* (2013.01)
USPC ........................................................ 708/322

(58) Field of Classification Search
CPC .......... H03H 21/0012; H03H 17/0294; H03H 21/0043; H04B 3/23; H04L 25/03043; H04L 2025/0351
USPC .................................................. 708/322–323
See application file for complete search history.

(56) References Cited

U.S. PATENT DOCUMENTS

| | | | |
|---|---|---|---|
| 5,812,217 A | * | 9/1998 | Cahill, III ..................... 348/614 |
| 6,426,972 B1 | | 7/2002 | Endres et al. |
| 2004/0240678 A1 | * | 12/2004 | Nakamura et al. ............ 708/322 |

OTHER PUBLICATIONS

Fan et al., "Efficient Robust Adaptive Decision Feedback Equalizer for Large Delay Sparse Channel," IEEE Transactions on Consumer Electronics, vol. 51, No. 2, May 2005, pp. 449-456.
Heo et al., "Adaptive Sparse Equalizer Robust to Fast Fading and Long Delay Spread for ATSC DTV," IEEE Transactions on Consumer Electronics, vol. 51, No. 3, Aug. 2005, pp. 803-808.
Kutz et al., "Determination of Tap Positions for Sparse Equalizers," IEEE Transactions on Communications, vol. 55, No. 9, Sep. 2007, pp. 1712-1724.
Oh et al., "Sparse Equalizer Using Adaptive Weight Activation for Fast Start-up in ATSC DTV Systems," ICCE, 2006, pp. 15-16.

* cited by examiner

*Primary Examiner* — Tan V. Mai
(74) *Attorney, Agent, or Firm* — Birch, Stewart, Kolasch & Birch, LLP (57) ABSTRACT

An adaptive filter is disclosed, having a plurality of computation groups, a plurality of computation circuits, a summation circuit, a slicer circuit, an updating circuit, and a control circuit. Each computation group corresponds to an equalization parameter and has a plurality of memory cells. When the corresponding equalization parameter of a computation group is greater than a predetermined value, the control circuit configures the computation group and the computation circuit to collaboratively generate an output of the computation group. The summation circuit sums up the outputs of the computation groups to produce a filter output. The slicer circuit generates a slicer output according to the filter output. The updating circuit updates the equalization parameters according to the filter output and the slicer output.

20 Claims, 6 Drawing Sheets

ADAPTIVE FILTER WITH REDUCED COMPUTATIONAL COMPLEXITY

CROSS-REFERENCE TO RELATED APPLICATIONS

This application claims the benefit of priority to Taiwanese Patent Application No. 100135120, filed on Sep. 28, 2011; the entirety of which is incorporated herein by reference for all purposes.

BACKGROUND

The disclosure generally relates to adaptive filters.

In many communication devices, the receiver circuit often utilizes the adaptive filter to equalize the interferences brought by the channel effects and therefore may recover the signals sent by the transmitter. In some applications, complicated adaptive filters are required to effectively equalize the channel effects. For example, in the Advanced Television Systems Committee (ATSC) digital television system, the receiver circuit usually requires an adaptive filter with hundreds or even thousands of taps.

As the length of the adaptive filter (i.e., the number of taps of the adaptive filter) increases, the adaptive filters must be equipped with a large memory and more computation circuits to generate the filter outputs and to update the equalization parameters of the adaptive filter circuits. Accordingly, the hardware requirement and the computation complexity of the adaptive filter increase, and the accompanied increase of the power consumption also result in the heat dissipation problem. The complexity of designing and integrating the adaptive filter with a long filter length in the system is inevitably increased.

On the other hand, shortening the length of the adaptive filter usually degrades the demodulation performance of the receiver circuit. The receiver circuit may not even successfully demodulate the received signals when the channel varies dramatically. Thus, it is not feasible to simply shorten the length of the adaptive filter for reducing the hardware requirement and the computation complexity of the receiver circuit.

SUMMARY

An example embodiment of an adaptive filter, comprising: an input end for receiving a plurality of input data; a plurality of computation groups, each of which comprises a plurality of data memory units for storing the input data received from the input end; a plurality of first parameter memory units for storing a plurality of first equalization parameters, wherein each of the first equalization parameters corresponding to one of the data memory units in one of the computation groups; a control circuit for configuring a plurality of second parameter memory units to store a plurality of second equalization parameters when the first equalization parameter corresponding to a first computation group of the computation groups is greater than a first predetermined value, and for configuring a plurality of third parameter memory units to store a plurality of third equalization parameters when the first equalization parameter corresponding to a second computation group of the computation groups is greater than a second predetermined value; a computation circuit for generating a first filter output according to the first equalization parameters, the data memory units corresponding to the first equalization parameters, the second equalization parameters, the data memory units corresponding to the second equalization parameters, the third equalization parameters, and the data memory units corresponding to the third equalization parameters; a parameter updating circuit for updating the first equalization parameters, the second equalization parameters, and the third equalization parameters according to the first filter output and a first slicer output generated by a slicer circuit; wherein the second equalization parameters corresponds to at least part of the data memory units of the first computation group; the third equalization parameters corresponds to at least part of the data memory units of the second computation group; and the first predetermined value and the second predetermined value may be configured to be the same or different.

Another example embodiment of an adaptive filter, comprising: an input end for receiving a plurality of input data; a memory access circuit for storing the input data in one or more data memory; a first computation circuit for calculating a first sum of products of a plurality of first equalization parameters and the input data stored in a plurality of first data memory units in the one or more data memory; a control circuit for configuring a second computation circuit to calculate a second sum of products of a plurality of second equalization parameters and the input data stored in a plurality of second data memory units in the one or more data memory when a first parameter in the first equalization parameters is greater than a first predetermined value, and for configuring a third computation circuit to calculate a third sum of products of a plurality of third equalization parameters and the input data stored in a plurality of third data memory units in the one or more data memory when a second parameter in the first equalization parameters is greater than a second predetermined value; and a summation circuit for generating a first filter output according to the first sum, the second sum, and the third sum; wherein the first computation circuit, the second computation circuit, and the third computation circuit respectively update the first equalization parameters, the second equalization parameters, and the third equalization parameters according to the first filter output and a first slicer output generated by a slicer circuit; and the first predetermined value and the second predetermined value may be configured to be the same or different.

Another example embodiment of an adaptive filter, comprising: an input end for receiving a plurality of input data; a memory access circuit for storing the input data in one or more data memory; a computation circuit for calculating a first sum of products of a plurality of first equalization parameters and the input data stored in a plurality of first data memory units in the one or more data memory; and a control circuit for configuring the computation circuit to calculate a second sum of products of a plurality of second equalization parameters and the input data stored in a plurality of second data memory units in the one or more data memory when a first parameter in the first equalization parameters is greater than a first predetermined value; wherein the computation circuit generates a first filter output and a first slicer output according to the first sum and the second sum; and the computation circuit updates the first equalization parameters and the second equalization parameters according to the first filter output and the first slicer output.

It is to be understood that both the foregoing general description and the following detailed description are example and explanatory only and are not restrictive of the invention, as claimed.

DETAILED DESCRIPTION

Reference will now be made in detail to embodiments of the invention, which are illustrated in the accompanying drawings.

Figure 1:
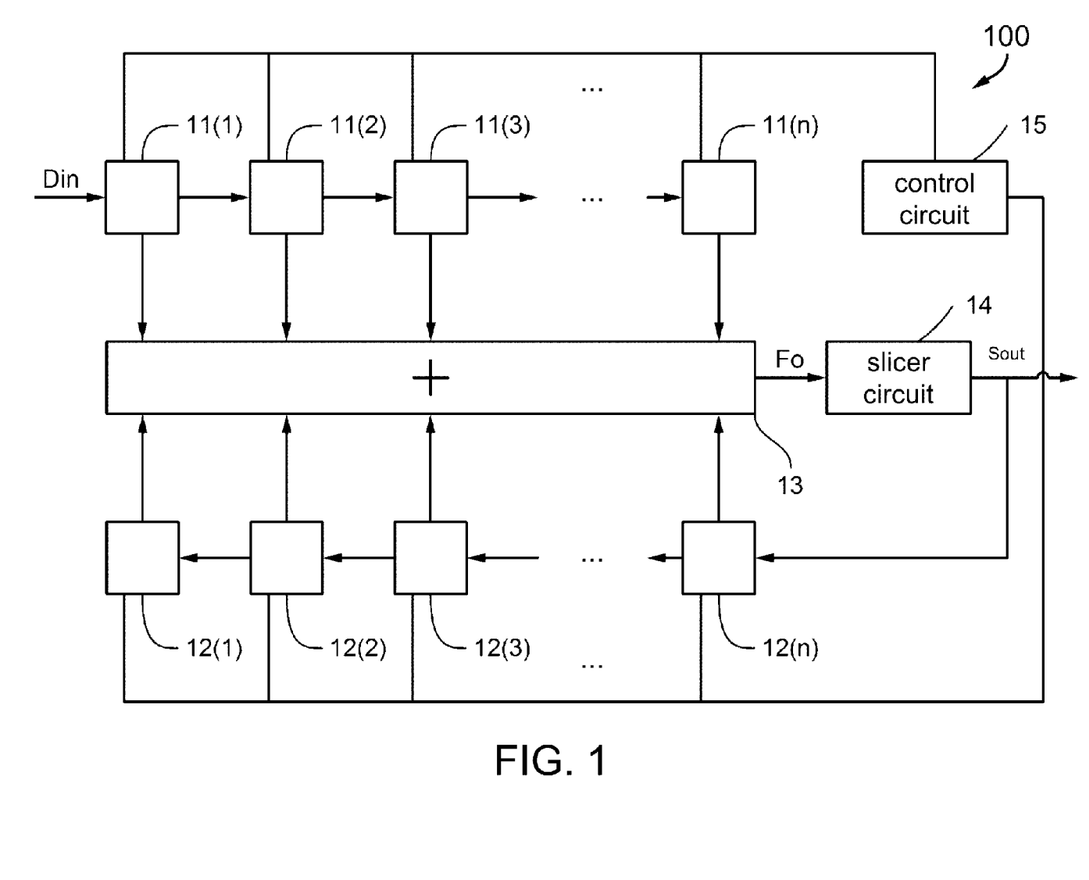
FIG. 1 shows a simplified functional block diagram of an example adaptive filter circuit.

FIG. 1 shows a simplified functional block diagram of an example adaptive filter circuit 100. The adaptive filter circuit 100 comprise computation groups 11(1), 11(2), 11(3) . . . 11(n), computation groups 12(1), 12(2) . . . 12(n), a summation circuit 13, a slicer circuit 14, and a control circuit 15.

The computation groups 11(1), 11(2), 11(3) . . . 11(n) and the computation groups 12(1), 12(2) . . . 12(n) respectively play the roles of the feed forward filter and the feed backward filter for equalizing the data Din received from an input end of the adaptive filter 100.

The summation circuit 13 may be realized with any suitable structure of adder circuits and/or logic circuits to sum up the outputs of the computation groups 11(1), 11(2), 11(3) . . . 11(n) and 12(1), 12(2) . . . 12(n) for generating the filter output Fo of the adaptive filter 100. For example, the summation circuit 13 may be realized with one or more carry look-ahead adders, carry save adders, and/or ripple carry adders.

The slicer circuit 14 may be realized with any suitable circuit structure for generating the slicer output Sout according to the output Fo of the summation circuit 13. For example, the slicer circuit 14 may be realized with a two-level data slicer, a multilevel data slicer, and/or an error correction decoder (e.g., the Viterbi decoder).

The control circuit 15 may be realized with any suitable circuit structure, and coupled with one or more computation groups for adjusting the computation complexity of the adaptive filter 100.

Figure 2:
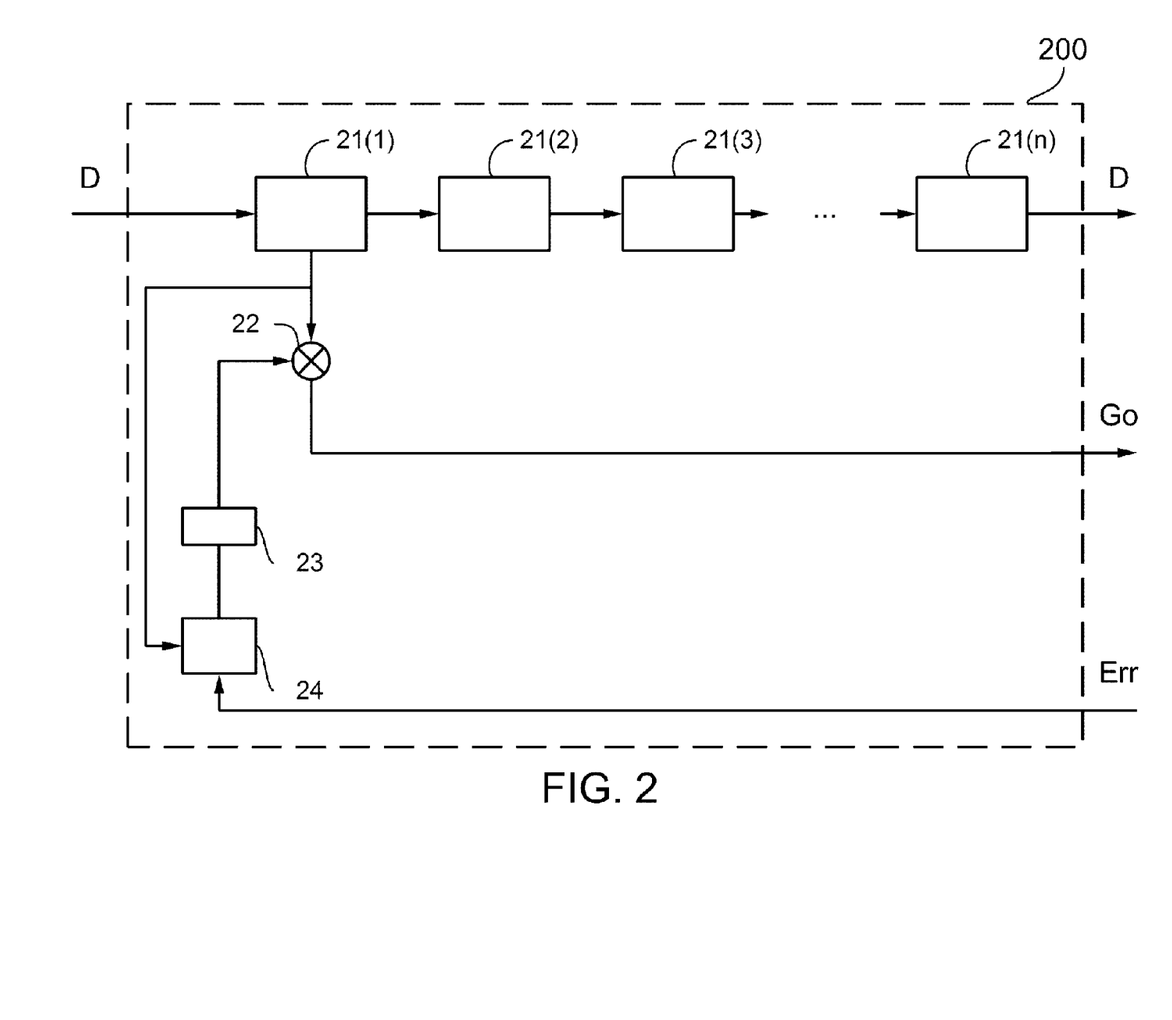
FIG. 2 shows a simplified functional block diagram of an example computation group of the adaptive filter in FIG. 1.
Figure 3:
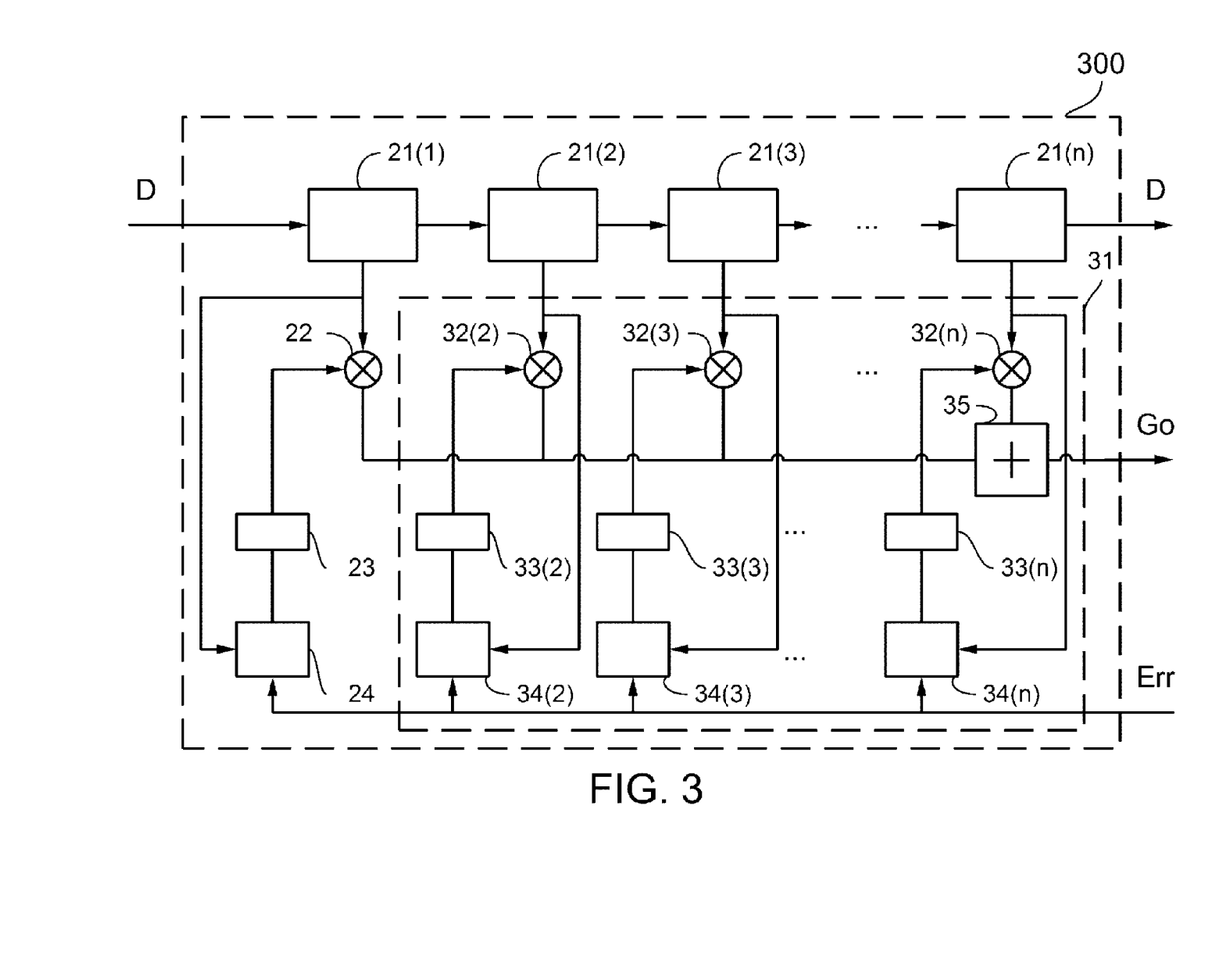
FIG. 3 shows a simplified functional block diagram of another example computation group of the adaptive filter in FIG. 1.

FIGS. 2 and 3 show two simplified functional block diagrams of two example computation groups of the adaptive filter in FIG. 1. The function and the operation of the adaptive filter 100 are further explained below with FIGS. 1~3.

In the embodiment in FIG. 2, the computation group 200 comprises data memory units 21(1), 21(2), 21(3) . . . 21(n), a multiply circuit 22, a parameter memory unit 23, and a parameter updating circuit 24.

The data memory units 21(1), 21(2), 21(3) . . . 21(n) and the parameter memory unit 23 may be respectively realized with tap delay lines, registers, SRAM, DRAM, or other memory circuits. The data memory units 21(1), 21(2), 21(3) . . . 21(n) may respectively receive data from the input end of the adaptive filter 100, the output end of the slicer circuit 14, another computation group, or another data memory unit. The data memory units 21(1), 21(2), 21(3) . . . 21(n) may also respectively transmit data to another computation group or another data memory unit. The parameter memory unit 23 is used to store the equalization parameter.

The multiply circuit 22 may be realized with the pipelined multiplier circuit, the array multiplier circuit, or other suitable structure of multiplier circuits for multiplying the equalization parameter stored in the parameter memory unit 23 by the data stored in the data memory unit 21(1) to produce the output Go of the computation group 200. The outputs of the computation groups in the adaptive filter 100 are summed by the summation circuit 13 to generate the filter output Fo.

The parameter updating circuit 24 may be realized with suitable circuit structure to perform the adaptive updating algorithms, e.g., the least mean square algorithm, the recursive least square algorithm, the sign-error algorithm, etc. The parameter updating circuit 24 may update the equalization parameter stored in the parameter memory unit 23 according to the data, the sign of the data stored in the data memory unit 21(1), the difference Err of the filter output Fo and the slicer output Sout, and/or the sign of the difference Err.

In the embodiment in FIG. 3, the control circuit 15 configures the computation circuit 31 to cooperate with the computation group 200 in FIG. 2. The computation circuit 31 and the computation group 200 in FIG. 2 are referred to as the computation group 300 below for conciseness. In this embodiment, the computation group 300 comprises the elements of the computation group 200, multiplier circuits 32(2), 32(3) . . . 32(n), parameter memory units 33(2), 33(3) . . . 33(n), parameter updating circuits 34(2), 34(3) . . . 34(n), and a summation circuit 35. The multiplier circuits, the parameter memory units, the parameter updating circuits, and the summation circuits in FIG. 3 may be realized with the structures described above or the other suitable structures.

In the computation group 300, the equalization parameters stored in the parameter memory units 23, 33(2), 33(3) . . . 33(n) are multiplied by the data stored in the data memory units 21(1), 21(2), 21(3) . . . 21(n), and the products thereof are summed by the summation circuit 35 to generate the output Go of the computation group 300. The outputs of the computation groups are summed by the summation circuit 13 to generate the filter output Fo.

The parameter updating circuit 24, 34(2), 34(3) . . . 34(n) may be realized with suitable circuit structures to perform any suitable adaptive updating algorithm, e.g., the algorithms mentioned above. The parameter updating circuits 24, 34(2), 34(3) . . . 34(n) may update the equalization parameters stored in the parameter memory units 23, 33(2), 33(3) . . . 33(n) according to the data, the sign of the data stored in the data memory unit 21(1), 21(2), 21(3) . . . 21(n), the difference Err of the filter output Fo and the slicer output Sout, and/or the sign of the difference Err.

For the purpose of clearer explanation, the multiplexer circuits, the memory access circuits, the logic circuits, the control signal of the control circuit 15, and/or other circuits are omitted in FIGS. 1~3. For example, the computation circuit 31 is not shown in FIG. 1.

In the disclosure, the control circuit 15 may monitor a parameter memory unit in a computation group to determine whether the computation group should cooperate with addition computation circuits. For conciseness, the parameter memory unit monitored by the control circuit 15 is referred to as the monitored parameter memory unit. When the parameter memory units are used to generate the output of the computation group or the filter output, or when the equalization parameters need to be updated by the parameter updating circuit, the parameter memory units are referred to as effective parameter memory units.

For example, in the computation group 200, the control circuit 15 monitors the equalization parameter stored in the parameter memory unit 23, which is used to generate the output Go of the computation group 200. Thus, the parameter memory unit 23 is a monitored and effective memory unit.

In the computation group 300, the control circuit 15 monitors the equalization parameter stored in the parameter memory unit 23, and the equalization parameters stored in the parameter memory units 23, 33(2), 33(3) ... 33(n) are used to generate the output Go of the computation group 300. Thus, the parameter memory unit 23 is a monitored and effective memory unit. The parameter memory units 33(2), 33(3) ... 33(n) are effective parameter memory units.

In the embodiments herein, the multiplier circuits 22, 32(2), 32(3) ... 32(n) and the summation circuit 35 may also be realized with a plurality of multiply-add circuits.

Figure 4:
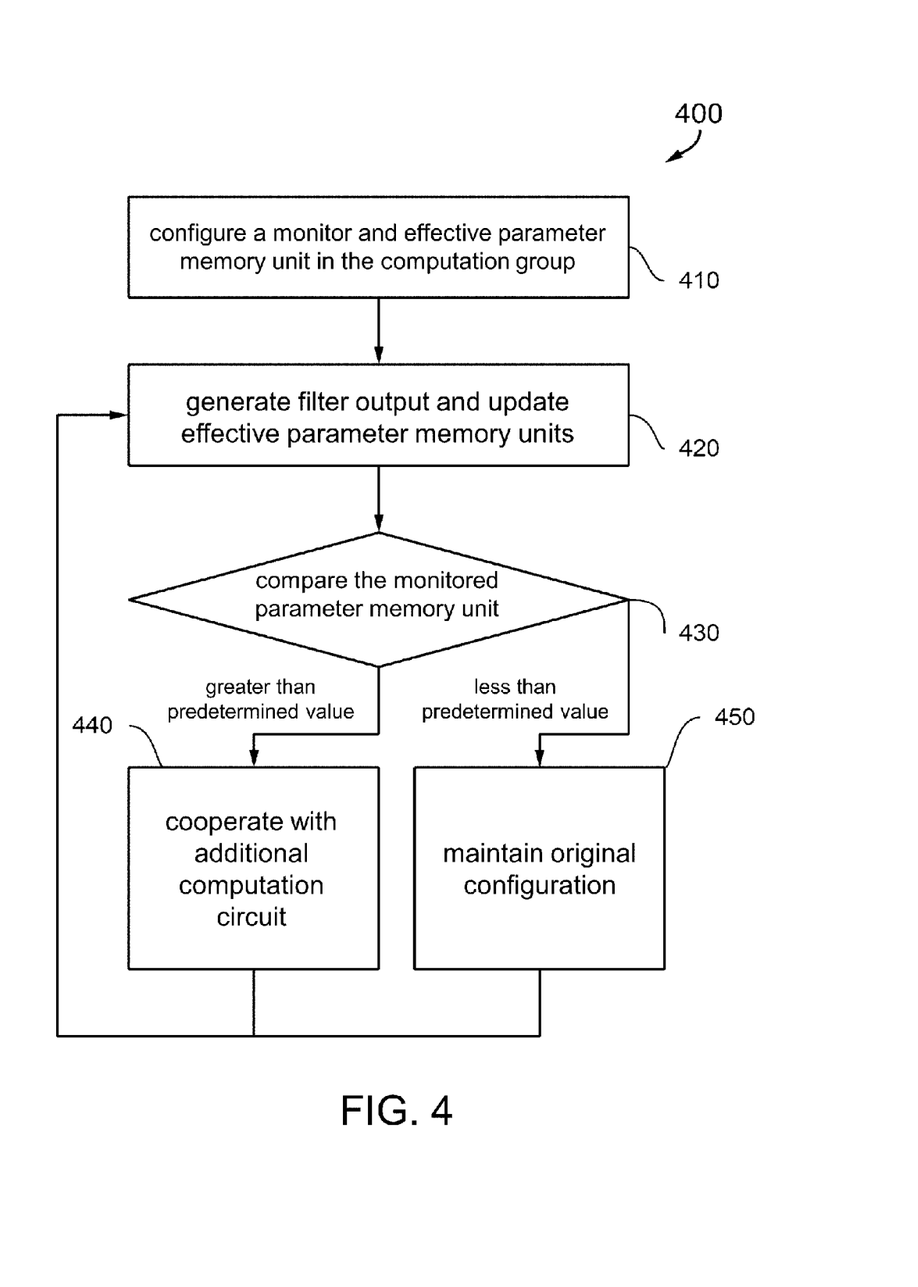
FIG. 4 shows a simplified flowchart of an example operating method of the adaptive filter in FIG. 1.

FIG. 4 shows a simplified flowchart of an example operating method of the adaptive filter 100 in FIG. 1. The function and operation of the adaptive filter 100 is further explained below with FIGS. 1~4.

In the operation 410, the control circuit 15 configures the computation groups 11(1), 11(2), 11(3) ... 11(n) and the computation groups 11(1), 11(2), 11(3) ... 11(n) to respectively comprise only one monitored and effective parameter memory unit. For example, the control circuit 15 configures each of the computation groups 11(1), 11(2), 11(3) ... 11(n) and the computation groups 12(1), 12(2), 12(3) ... 12(n) to be the same as or similar to the configuration of the computation group 200.

In the operation 420, the adaptive filter 100 receives the input data Din from the input end. The equalization parameters stored in the effective parameter memory units and the data stored in the corresponding data memory units are multiplied by the multiplier circuits to generate the outputs of the computation groups. The outputs of the computation groups are summed by the summation circuit 13 to generate the filter output Fo. The slicer circuit 14 generates the slicer output Sout according to the filter output Fo. Moreover, the parameter updating circuits of the computation groups updates the equalization parameters stored in the effective parameter memory units according to the filter output Fo, the slicer output So, other data (when necessary), and a suitable adaptive updating algorithm.

In the operation 430, the control circuit 15 compares the equalization parameters stored in the monitored parameter memory units of the computation groups with a predetermined value. When the equalization parameter stored in the monitored parameter memory unit is greater than the predetermined value, the method proceeds to the operation 440. When the equalization parameter stored in the monitored parameter memory unit is less than the predetermined value, the method proceeds to the operation 450.

In the operation 440, the control circuit 15 configures one or more computation circuits to cooperation with the computation group for generating the output of the computation group and for updating the equalization parameter(s) stored in the effective parameter memory unit(s). For example, the control circuit 15 may configure one or more computation groups to be the same as or similar to the configuration of the computation group 300.

In the operation 450, the control circuit 15 configures the computation group to generate the output of the computation group or to update the equalization parameter(s) stored in the effective parameter memory unit(s) without changing the configuration (e.g., maintain the configuration of the computation group to be the same as or similar to the computation group 200).

Figure 5:
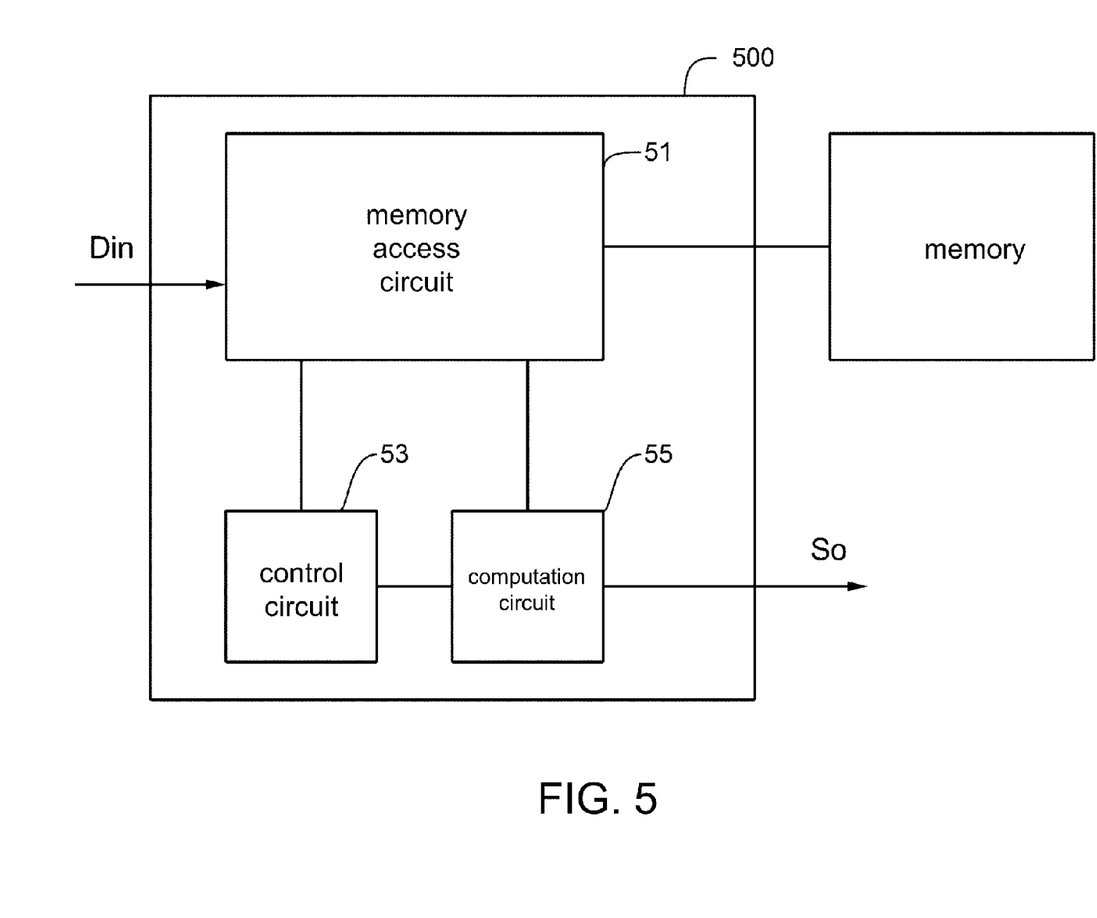
FIG. 5 shows a simplified functional block diagram of another example adaptive filter circuit.

FIG. 5 shows a simplified functional block diagram of another example adaptive filter circuit 500. The adaptive filter 500 comprises a memory access circuit 51, a control circuit 53, and a computation circuit 55. The memory in FIG. 5 may be realized with the memory devices mentioned above which may be built at the interior and/or the exterior of the adaptive filter 500. In this embodiment, the memory is configured at the exterior of the adaptive filter 500.

In the adaptive filter 500, the memory access circuit 51 is used to receive the input data Din from the input end and store the input data Din to the memory. The control circuit 53 is used to configure the memory access circuit 51 to access the data and the equalization parameters stored in the memory, and configure the computation circuit 55 to sum up the products of the data multiplied by the corresponding equalization parameters to generate the equalized filter output. Moreover, the computation circuit 55 may generate the slicer output Sout according to the filter output, and update the equalization parameters according to the filter output, the slicer output, other data (when necessary), and a suitable adaptive updating algorithm. The memory access circuit 51 may also store the updated equalization parameters to the memory in FIG. 5 or another memory unit.

Figure 6:
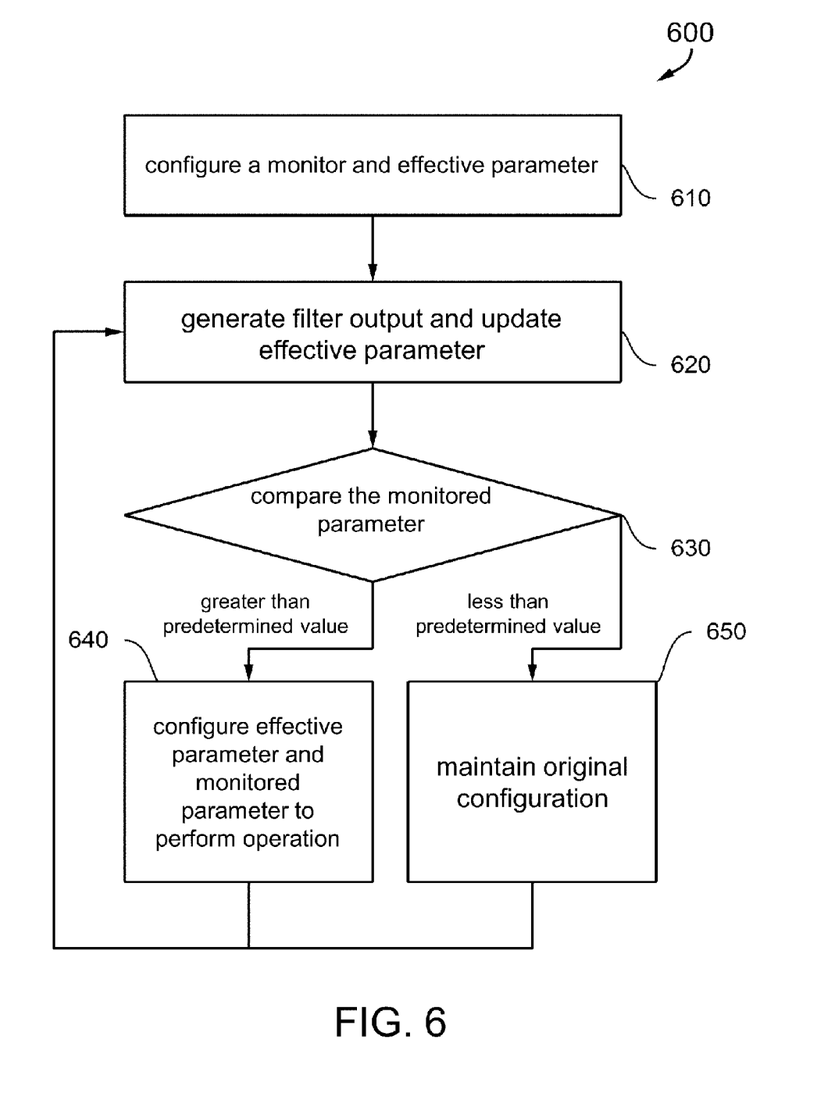
FIG. 6 shows a simplified flowchart of an example operating method of the adaptive filter in FIG. 5, all in accordance with at least some embodiments of the disclosure described herein.

FIG. 6 shows a simplified flowchart of an example operating method of the adaptive filter 500 in FIG. 5. The function and operation of the adaptive filter 500 is further explained below with FIGS. 5 and 6.

In the operation 610, the memory access circuit 51 stores a plurality of equalization parameters in the memory. The control circuit 53 monitors the value of these equalization parameters. The equalization parameters monitored by the control circuit 53 are referred to as the monitored equalization parameters for conciseness. Moreover, the equalization parameters used to generate the filter output are referred to as the effective equalization parameters. In this embodiment, the monitored equalization parameters are also configured as the effective equalization parameters.

In the operation 620, the memory access circuit 51 receives the input data Din from the input end, accesses the effective equalization parameters and the corresponding data, and transmits the data and the effective equalization parameters to the computation circuit 55. The computation circuit 55 performs multiplication operations and summation operations according to the data and the corresponding effective equalization parameters to generate the filter output. The computation circuit 55 generates the slicer output according to the filter output. The computation circuit 55 further updates the equalization parameters according to the filter output, the slicer output, other data (when necessary), and a suitable adaptive updating algorithm.

In the operation 630, the control circuit 53 compares the monitored equalization parameters with the predetermined value. When the equalization parameter is greater than the predetermined value, the method proceeds to the operation 640. When the equalization parameter is less than the predetermined value, the method proceeds to the operation 650.

In the operation 640, the control circuit 53 configures the monitored equalization parameter to be accompanied with one or more effective equalization parameters to generate the filter output and the slicer output in the following operation.

In the operation 650, the control circuit 53 continues to generate the filter output and the slicer output according without changing the configuration.

In the embodiments above, the control circuit may configures the initial values of the equalization parameters to be 0 or other suitable value when the control circuit configures the parameter memory units to cooperate with the computation groups.

In other embodiments, the number of taps of the computation groups in FIG. 1 may be respectively configured to be the same or different. The control circuit may monitor the equalization parameters at the same tap in the computation groups or at different taps in the computation groups.

In other embodiments, the parameter memory unit 23 in FIG. 2 may be configured to cooperate with any suitable data memory unit in FIG. 2.

In other embodiments, the control circuit 15 may monitor more than one equalization parameter stored in the parameter memory units of a computation group. The number of monitored parameter memory units is, however, less than the number of the data memory units so that the computation complexity may be reduced.

In other embodiments, the parameter memory units 33(2), 33(3) . . . 33(n) may also be configured as the monitored parameter memory unit, respectively.

In the operation 410 of other embodiments, one or more computation groups may be configured to comprise more than one effective parameter memory unit. For example, in some important computation groups, the number of effective parameter memory units may be equal to the number of the data memory units.

In the operation 430 of other embodiments, the control circuit 15 may omit monitoring some computation groups (e.g., the important computation groups) and does not change the configuration of the effective parameter memory units of these omitted computation groups.

In the operations 430 or 630 of other embodiments, the control circuit may compare the equalization parameters in the computation group with one or more predetermined parameters. For example, when the monitored equalization parameter is greater than a first predetermined value, the method proceeds to the operation 440. When the monitored equalization parameter is less than a second predetermined value, the method proceeds to the operation 450. Moreover, the control circuit may compare the equalization parameters of the computation groups respectively with the same predetermined parameter(s) or different predetermined parameters.

In the operations 430 or 630 of other embodiments, the control circuit may configure the duration of time between each comparisons of the monitored equalization parameters to further reduce the computation complexity. For example, the control circuit may perform the comparison in the operation 430 or 630 after processing every 100 input data.

In the operations 430 or 630 of other embodiments, the control circuit may also compare equalization parameters in the effective parameter memory units with the predetermined value(s). For example, the control circuit may compare the predetermined value(s) with the maximum of the equalization parameters in the effective parameter memory units, the minimum of the equalization parameters in the effective parameter memory units, part of the equalization parameters in the effective parameter memory units, all of the equalization parameters in the effective parameter memory units, and/or the absolute value of the equalization parameters in the effective parameter memory units.

In the operations 440 450, 640 and 650 of other embodiments, the computation circuits and/or the effective equalization parameter memory units may be configured with other suitable mechanisms. For example, in the operation 440, the control circuit may configure a computation circuit to cooperate with a half of the data memory units and configure another computation circuit to cooperate with the other half of the data memory units respectively in the same duration of time of in different durations of time.

In other embodiments, the monitor parameter memory unit may be configured to be not one of the effective parameter memory units.

In other embodiments, when the number of computation circuits required by the control circuit is less than the total number of the computation circuits, the control circuit may compare the maximum of the equalization parameters in the effective parameter memory units, part of the equalization parameters in the effective parameter memory units, all of the equalization parameters in the effective parameter memory units to perform selection. The computation circuits are assigned to the computation groups with greater equalization parameters.

In other embodiments, when the number of computation circuits required by the control circuit is less than the total number of the computation circuits, the control circuit may increase the clock of the operation circuits so that the computation circuits may calculate a plurality of outputs for a plurality of computation groups. For example, a first computation circuit may generate a first sum of products of the first equalization parameters and the data stored in the corresponding data memory units. A second computation circuit with faster operation speed may generate a second sum of products of the second equalization parameters and the data stored in the corresponding data memory units, and generate a third sum of products of the third equalization parameters and the data stored in the corresponding data memory units. The first computation circuit may update the first equalization parameters in the first parameter memory units and a second computation circuit with fast operation speed may update the second equalization parameters in the second parameter memory units and the third equalization parameters in the third parameter memory units.

In other embodiments, the adaptive filters 100 and 500 may operate at a rate more than the baud rate of the system. For example, the adaptive filters 100 and 500 may be realized with fractional spaced filters.

The number, positions, and connections of the elements in the disclosure are only illustrative for the purpose of clearer explanation. A functional block in the disclosure may be realized with a plurality of circuit elements, and a plurality of functional blocks in the disclosure may be realized with a circuit elements. For example, the multiplier circuits 22, 32(2), 32(3) . . . 32(n) and the summation circuit 35 in FIG. 3 may be realized with a plurality of multiply-add circuits. The summation circuit 13 in FIG. 1 may also be integrated into the multiplier circuits and/or the summation circuits of the computation groups, and realized with one or more circuit elements.

In the above embodiments, the control circuit may monitor the equalization parameters of the computation groups and assign the computation circuits and the effective parameter memory units to the computation groups which require more computation power. The resource may be dynamically allocated to the computation groups according to the required computation complexity. Thus, the computation complexity and the hardware requirement may be reduced and the system performance may be still maintained when the channel varies dramatically.

The same reference numbers may be used throughout the drawings to refer to the same or like parts or components/operations. Certain terms are used throughout the description and following claims to refer to particular components. As one skilled in the art will appreciate, a component may be referred by different names. This document does not intend to distinguish between components that differ in name but not in function. In the following description and in the claims, the term "comprise" is used in an open-ended fashion, and thus should be interpreted to mean "include, but not limited to . . . " Also, the phrase "coupled with" is intended to compass any indirect or direct connection. Accordingly, if this document mentioned that a first device is coupled with a second device, it means that the first device may be directly or indirectly connected to the second device through electrical connections, wireless communications, optical communications, or other signal connections with/without other intermediate devices or connection means.

As used herein, the term "and/or" includes any and all combinations of one or more of the associated listed items. In addition, the singular forms "a", "an", and "the" as used herein are intended to include the plural forms as well, unless the context clearly indicates otherwise.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An adaptive filter, comprising:
an input end for receiving a plurality of input data;
a plurality of computation groups, each of which comprises a plurality of data memory units for storing the input data received from the input end;
a plurality of first parameter memory units for storing a plurality of first equalization parameters, wherein each of the first equalization parameters corresponding to one of the data memory units in one of the computation groups;
a control circuit for configuring a plurality of second parameter memory units to store a plurality of second equalization parameters when the first equalization parameter corresponding to a first computation group of the computation groups is greater than a first predetermined value, and for configuring a plurality of third parameter memory units to store a plurality of third equalization parameters when the first equalization parameter corresponding to a second computation group of the computation groups is greater than a second predetermined value;
a computation circuit for generating a first filter output according to the first equalization parameters, the data memory units corresponding to the first equalization parameters, the second equalization parameters, the data memory units corresponding to the second equalization parameters, the third equalization parameters, and the data memory units corresponding to the third equalization parameters;
a parameter updating circuit for updating the first equalization parameters, the second equalization parameters, and the third equalization parameters according to the first filter output and a first slicer output generated by a slicer circuit;
wherein the second equalization parameters corresponds to at least part of the data memory units of the first computation group; the third equalization parameters corresponds to at least part of the data memory units of the second computation group; and the first predetermined value and the second predetermined value may be configured to be the same or different.

2. The adaptive filter of claim 1, wherein
the control circuit configures initial values of the second equalization parameters to be 0 when the control circuit configures the second parameter memory units to store the second equalization parameters; and
the control circuit configures initial values of the third equalization parameters to be 0 when the control circuit configures the third parameter memory units to store the third equalization parameters.

3. The adaptive filter of claim 1, further comprising:
a first multiply-add circuit for generating a first sum of products of the first equalization parameters and the input data stored in the corresponding data memory units;
a second multiply-add circuit for generating a second sum of products of the second equalization parameters and the input data stored in the corresponding data memory units; and
a third multiply-add circuit for generating a third sum of products of the third equalization parameters and the input data stored in the corresponding data memory units;
wherein the computation circuit generates the first filter output according to the first sum, the second sum, and the third sum.

4. The adaptive filter of claim 1, further comprising:
a first multiply-add circuit for generating a first sum of products of the first equalization parameters and the input data stored in the corresponding data memory units; and
a second multiply-add circuit for generating a second sum of products of the second equalization parameters and the input data stored in the corresponding data memory units, and for generating a third sum of products of the third equalization parameters and the input data stored in the corresponding data memory units;
wherein the computation circuit generates the first filter output according to the first sum, the second sum, and the third sum.

5. The adaptive filter of claim 1, further comprising:
a first updating circuit for updating the first equalization parameters in the first parameter memory units according to the first filter output and the first slicer output;
a second updating circuit for updating the second equalization parameters in the second parameter memory units according to the first filter output and the first slicer output; and
a third updating circuit for updating the third equalization parameters in the third parameter memory units according to the first filter output and the first slicer output.

6. The adaptive filter of claim 1, further comprising:
a first updating circuit for updating the first equalization parameters in the first parameter memory units according to the first filter output and the first slicer output; and
a second updating circuit for updating the second equalization parameters in the second parameter memory units and for updating the third equalization parameters in the third parameter memory units according to the first filter output and the first slicer output.

7. The adaptive filter of claim 1, wherein
the computation circuit generates a second filter output according to the first equalization parameters, the data memory units corresponding to the first equalization parameters, the third equalization parameters, and the data memory units corresponding to the third equalization parameters when the first equalization parameter stored in the first parameter memory units corresponding to the first computation group is less than a third predetermined value or when the maximum of the second equalization parameters, part of the second equalization parameters, or all of the second equalization parameters are less than a fourth predetermined value;
the updating circuit updates the equalization parameters in the first parameter memory units and the third parameter memory units according to the second filter output and a second slicer output generated by the slicer circuit; and the first predetermined value, the second predetermined value, the third predetermined value, and the fourth predetermined value may be respectively configured to be the same or different.

8. The adaptive filter of claim 1, wherein the control circuit configures the second parameter memory units to store a plurality of fourth equalization parameters corresponding to at least part of the data memory units of the third computation group when the first equalization parameter corresponding to the third computation group is greater than the first equalization parameter corresponding to the first computation group or greater than the maximum of the second equalization parameters;

the computation circuit generates a third filter output according to the first equalization parameters, the data memory units corresponding to the first equalization parameters, the third equalization parameters, the data memory units corresponding to the third equalization parameters, the fourth equalization parameters, and the data memory units corresponding to the fourth equalization parameters; and the updating circuit updates the equalization parameters stored in the first parameter memory units, the second parameter memory units, and the third parameter memory units according to the third filter output and a third slicer output generated by the slicer circuit.

9. The adaptive filter of claim 1, further comprising:

a plurality of fifth parameter memory units for storing a plurality of fifth equalization parameters, which correspond to at least part of the data memory units in a fourth computation group of the computation groups.

10. An adaptive filter, comprising:

an input end for receiving a plurality of input data;

a memory access circuit for storing the input data in one or more data memory;

a first computation circuit for calculating a first sum of products of a plurality of first equalization parameters and the input data stored in a plurality of first data memory units in the one or more data memory;

a control circuit for configuring a second computation circuit to calculate a second sum of products of a plurality of second equalization parameters and the input data stored in a plurality of second data memory units in the one or more data memory when a first parameter in the first equalization parameters is greater than a first predetermined value, and for configuring a third computation circuit to calculate a third sum of products of a plurality of third equalization parameters and the input data stored in a plurality of third data memory units in the one or more data memory when a second parameter in the first equalization parameters is greater than a second predetermined value; and a summation circuit for generating a first filter output according to the first sum, the second sum, and the third sum;

wherein the first computation circuit, the second computation circuit, and the third computation circuit respectively update the first equalization parameters, the second equalization parameters, and the third equalization parameters according to the first filter output and a first slicer output generated by a slicer circuit; and the first predetermined value and the second predetermined value may be configured to be the same or different.

11. The adaptive filter of claim 10, wherein the control circuit configures initial values of the second equalization parameters to be 0 when the control circuit configures the second computation circuit to calculate the second sum; and the control circuit configures initial values of the third equalization parameters to be 0 when the control circuit configures the third computation circuit to calculate the third sum.

12. The adaptive filter of claim 10, wherein the summation circuit generates a second filter output according to the first sum and the third sum when the first parameter is less than a third predetermined value or when the maximum of the second equalization parameters, part of the second equalization parameters, or all of the second equalization parameters are less than a fourth predetermined value;

the first computation circuit and the third computation circuit respectively update the first equalization parameters and the third equalization parameters according to the second filter output and a second slicer output generated by the slicer circuit; and the first predetermined value, the second predetermined value, the third predetermined value, and the fourth predetermined value may be respectively configured to be the same or different.

13. The adaptive filter of claim 10, wherein the control circuit configures the second computation circuit to calculate a fourth sum of products of a plurality of fourth equalization parameters and the input data stored in a plurality of fourth data memory units in the one or more data memory when a third parameter in the first equalization parameters is greater than a fifth predetermined value or the maximum of the second equalization parameters;

the summation circuit generates a third filter output according to the first sum, the third sum, and the fourth sum;

the first computation circuit, the second computation circuit, and the third computation circuit respectively update the first equalization parameters, the fourth equalization parameters, and the third equalization parameters according to the third filter output and a third slicer output generated by the slicer circuit; and the first predetermined value and the fifth predetermined value may be configured to be the same or different.

14. The adaptive filter of claim 10, further comprising:

a fourth computation circuit for calculating a fifth sum of products of a plurality of fifth equalization parameters and the input data stored in a plurality of fifth data memory units in the one or more data memory, and for updating the fifth equalization parameters according to outputs of the summation circuit and the slicer circuit.

15. The adaptive filter of claim 10, wherein the control circuit configures the second computation circuit to calculate the second sum and to calculate a fourth sum of products of a plurality of fourth equalization parameters and the input data stored in a plurality of fourth data memory units in the one or more data memory when a third parameter in the first equalization parameters is greater than a fifth predetermined value;

the summation circuit generates a third filter output according to the first sum, the second sum, the third sum, and the fourth sum;

the first computation circuit and the third computation circuit respectively update the first equalization parameters and the third equalization parameters according to the third filter output and a third slicer output generated by the slicer circuit;

the second computation circuit updates the second equalization parameters according to the third filter output and the third slicer output; and the first predetermined value, the second predetermined value, and the fifth predetermined value may be respectively configured to be the same or different.

16. The adaptive filter of claim 10, further comprising:
a fifth computation circuit; wherein
the memory access circuit stores a plurality of outputs of the slicer circuit in one or more slicer memory;
the fifth computation circuit calculates a six sum of products of a plurality of six equalization parameters and the input data stored in a plurality of six data memory units in the one or more data memory;
the control circuit configure the fifth computation circuit to calculate a seventh sum of products of a plurality of seventh equalization parameters and the input data stored in a plurality of seventh data memory units in the one or more data memory when a fourth parameter in the sixth equalization parameters is greater than a sixth predetermined value;
the summation circuit generates a fourth filter output according to the first sum, the second sum, the third sum, the sixth sum, and the seventh sum;
the first computation circuit, the second computation circuit, the third computation circuit, the fifth computation circuit, and the sixth computation circuit updates the first equalization parameters, the second equalization parameters, the third equalization parameters, the sixth equalization parameters, and the seventh equalization parameters according to the fourth filter output and a fourth slicer output generated by the slicer circuit; and
the first predetermined value and the sixth predetermined value may be configured to be the same or different.

17. An adaptive filter, comprising:
an input end for receiving a plurality of input data;
a memory access circuit for storing the input data in one or more data memory;
a computation circuit for calculating a first sum of products of a plurality of first equalization parameters and the input data stored in a plurality of first data memory units in the one or more data memory; and
a control circuit for configuring the computation circuit to calculate a second sum of products of a plurality of second equalization parameters and the input data stored in a plurality of second data memory units in the one or more data memory when a first parameter in the first equalization parameters is greater than a first predetermined value;
wherein the computation circuit generates a first filter output and a first slicer output according to the first sum and the second sum; and the computation circuit updates the first equalization parameters and the second equalization parameters according to the first filter output and the first slicer output.

18. The adaptive filter of claim 17, wherein
the computation circuit generates a second filter output and a second slicer output according to the first sum when the first parameter is less than a second predetermined value or when the maximum of the second equalization parameters, part of the second equalization parameters, or all of the second equalization parameters are less than a third predetermined value;
the computation circuit updates the first equalization values according to the second filter output and the second slicer output; and
the first predetermined value, the second predetermined value, and the third predetermined value may be respectively configured to be the same or different.

19. The adaptive filter of claim 17, wherein
the control circuit configures the computation circuit to calculate a third sum of products of a plurality of third equalization parameters and the input data stored in a plurality of third data memory units in the one or more data memory when a third parameter in the first equalization parameters is greater than a fourth predetermined value or the maximum of the second equalization parameters;
the computation circuit generates a third filter output and a third slicer output according to the first sum and the third sum;
the computation circuit updates the first equalization parameters and the third equalization parameters according to the third filter output and the third slicer output; and
the first predetermined value and the fourth predetermined value may be configured to be the same or different.

20. The adaptive filter of claim 17, wherein
the memory access circuit stores a plurality of slicer outputs of the slicer circuit in one or more slicer memory;
the computation circuit calculates a fourth sum of products of a plurality of fourth equalization parameters and the input data stored in a plurality of fourth data memory units in the one or more data memory;
the control circuit configure the computation circuit to calculate a fifth sum of products of a plurality of fifth equalization parameters and the input data stored in a plurality of fifth data memory units in the one or more data memory when a third parameter in the fourth equalization parameters is greater than a fifth predetermined value;
the summation circuit generates a fourth filter output according to the first sum, the second sum, the fourth sum, and the fifth sum;
the computation circuit updates the first equalization parameters, the second equalization parameters, the fourth equalization parameters, and the fifth equalization parameters according to the fourth filter output and a fourth slicer output; and
the first predetermined value and the fifth predetermined value may be configured to be the same or different.

* * * * *